United States Patent [19]

Lee

[11] Patent Number: 5,041,886

[45] Date of Patent: Aug. 20, 1991

[54] NONVOLATILE SEMICONDUCTOR MEMORY DEVICE AND MANUFACTURING METHOD THEREOF

[75] Inventor: Soo-Cheol Lee, Seoul, Rep. of Korea

[73] Assignee: Samsung Electronics Co., Ltd., Kyunggi, Rep. of Korea

[21] Appl. No.: 412,305

[22] Filed: Sep. 25, 1989

[30] Foreign Application Priority Data

Aug. 17, 1989 [KR] Rep. of Korea .................... 89-11731

[51] Int. Cl.⁵ ............................................. H01L 29/68
[52] U.S. Cl. .................................... 357/23.5; 357/54; 365/185
[58] Field of Search ...................... 357/23.5, 23.6, 54; 365/104, 185

[56] References Cited

U.S. PATENT DOCUMENTS 4,794,565 12/1988 Wu et al. ............................. 357/23.5

FOREIGN PATENT DOCUMENTS 57-196580 12/1982 Japan .................................. 357/23.5
58-54668 3/1983 Japan .................................. 357/23.5

OTHER PUBLICATIONS

Larsen et al., "Floating-Gate Device with Dual Control Gates," *IBM Technical Disclosure Bulletin*, vol. 21, No. 8, Jan. 1979, p. 3368.

*Primary Examiner*—Andrew J. James
*Assistant Examiner*—Courtney A. Bowers
*Attorney, Agent, or Firm*—Cushman, Darby & Cushman

[57] ABSTRACT

A nonvolatile semiconductor memory device is provided including a doped semiconductor substrate and three gate conductor layers electrically insulated from each other in the cell area on the substrate. A first floating gate conductor layer is formed on the substrate and covered by a second control gate conductor layer, forming a twofold polycrystalline silicon structure. A third select gate conductor layer is formed along one side wall of the twofold structure of the floating gate and control gate conductor layers, having a side wall spacer structure. The first conductor layer serves as a floating gate; the second conductor layer serves as a control gate; and the third conductor layer serves as a select gate. A field oxide layer is provided to separate cells from each other. The control and the select gates are connected in a region between cells through the field oxide layer. By providing the third conductor in the form of a side wall spacer, the cell area can be greatly reduced.

7 Claims, 7 Drawing Sheets

NONVOLATILE SEMICONDUCTOR MEMORY DEVICE AND MANUFACTURING METHOD THEREOF

FIELD OF THE INVENTION

The present invention relates to a nonvolatile semiconductor memory device and a manufacturing method therefor. In particular, it is directed to a new nonvolatile EEPROM (Electrically Erasable & Programmable Read Only Memory) having a side wall spacer gate and a fabrication method for producing the same.

BACKGROUND OF THE INVENTION

For a data-processing system, a memory device for storing information is very important. There are two kinds of semiconductor memory devices. One kind is volatile; volatile memory devices lose their contents when power is interrupted. Another kind is nonvolatile; nonvolatile memory devices retain their contents despite power failure. The applications of nonvolatile memory devices have been restricted by various practical difficulties, such as those relating to the capability to change the content of stored data, and to limitations on manipulations during use.

On the other hand, nonvolatile memory devices which adopt the MOS floating gate structure have been widely used. These devices use a floating gate, which is made of conductive material and is electrically insulated from the substrate, and the gate is capacitively coupled with the substrate. Therefore a MOS transistor, capable of detecting the charged condition of the floating gate, can be formed. According to the existence of charge within the floating gate, the MOS transistor can be in the conducting state (ON) or in the non-conducting state (OFF), and hence it can keep the data of "1" or "0". As a mechanism to inject charge into or to remove charge from the floating gate, hot electrons generated by avalanche breakdown or by the tunneling effect are used, respectively.

Among these nonvolatile semiconductor memory devices, the demand for EEPROM in which data is electrically erased and programmed has increased.

A 128K flash EEPROM semiconductor memory device using double polycrystalline silicon technology was disclosed at the IEEE International Solid-State Circuits Conference held in 1987. (See pp. 76–77 of conference digest.)

As shown in FIG. 1 and FIG. 2, the cell structure of the conventional flash EEPROM has an electrically insulated first polycrystalline silicon layer 4 on the substrate 1 in the vicinity of the drain region, between the drain region 3 and the source region 2, as a floating gate. Moreover the cell structure also has a second polycrystalline silicon layer 5 which, in the vicinity of the drain region, covers the first polycrystalline silicon layer 4 and, in the vicinity of the source region, covers the substrate 1. The covering part of the second polycrystalline silicon layer 5 on the first polycrystalline silicon layer 4 is furnished as a control gate, and the part of the substrate 1 nearby the source region is furnished as a select gate. This integral structure of the control gate and select gate have some advantages, in that it improves the efficiency of programming or reading. It is not sensitive to fluctuation of the erase voltage since during reading, it is controlled by the select gate, even if excessive electrons are drawn from the floating gate during erase. With that, problems generated by differences between cells within the same chip are solved.

However, in the structure, since the second polycrystalline silicon layer has coverage according to the first polycrystalline silicon layer, the second polycrystalline silicon layer must have a sufficiently wide width, in consideration of misalignment during the fabrication process. Therefore, it has a disadvantage in that the area of a cell is relatively increased. That disadvantage is a factor against the attainment of large capacity flash EEPROM.

Furthermore, in the drain region of this structure, the second polycrystalline silicon layer is not allowed to cover the outside of the first polycrystalline silicon layer. In consideration of that requirement, self align etching is performed during the fabrication process. But that involves disadvantage in etching the substrate in the source region. If the drain region and the source region are etched separately to avoid the disadvantage, the cell area would be designed to have a larger width.

SUMMARY OF THE INVENTION

It is an object of the present invention to provide a nonvolatile semiconductor memory device having a new select gate having a side wall spacer structure to solve the difficulties in prior technology.

It is another object of the present invention to provide a nonvolatile semiconductor memory device capable of decreasing the area of a memory cell.

It is further another object of the present invention to provide a manufacturing method especially suitable for fabricating the semiconductor memory device according to this invention.

The memory device according to the present invention comprises a single crystal semiconductor substrate, doped with n-type or p-type impurities, and a group of electrically insulated gate conductors on that substrate. The group of gate conductors includes a first conductor provided as a floating gate, a second conductor covering the first conductor and provided as a control gate, and a third conductor formed along one side wall of the twofold structure of the first and second conductors in the form of a side wall spacer and provided as a select gate.

The second conductor, provided as a control gate, and the third conductor, provided as a select gate, are connected on the field oxide layer, i.e. the separating region between cells. By providing the third conductor in the form of a side wall spacer, the cell area can be greatly reduced.

BRIEF DESCRIPTION OF THE DRAWINGS

FIGS. 7A, 7B through FIG. 16A, 15B are cross-sectional views taken along the lines B—B and C—C of FIG. 3, showing an example of a suitable processing sequence for completing the structure of the present invention.

DETAILED DESCRIPTION

Figure 1:
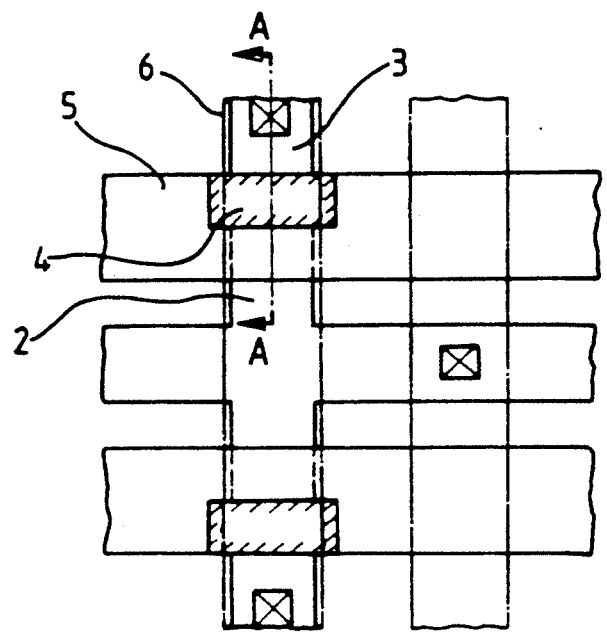
FIG. 1 is a plan view showing the cell array of a conventional flash EEPROM semiconductor memory device.
Figure 2:
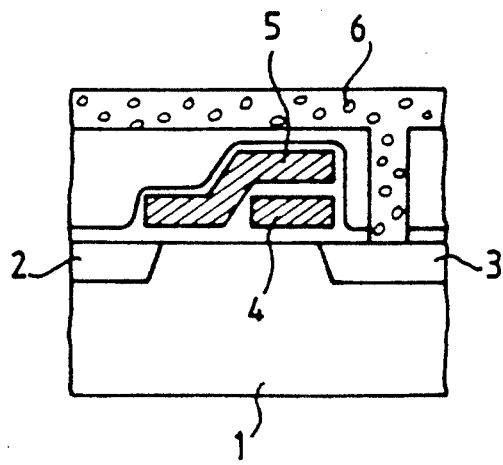
FIG. 2 is a cross-sectional view taken along the line A—A of FIG. 1.
Figure 3:
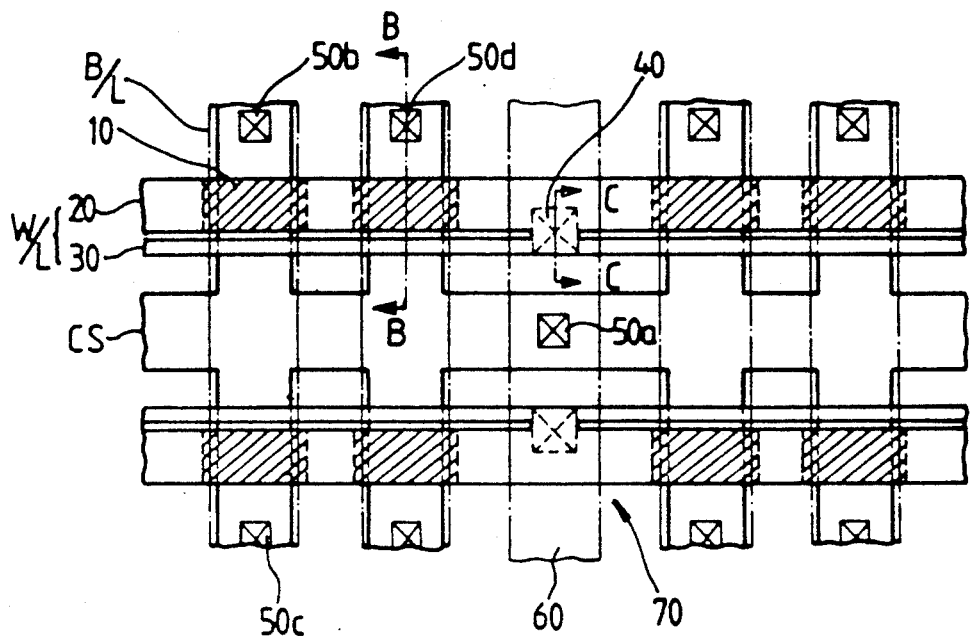
FIG. 3 is a plan view showing the cell array of the flash EEPROM semiconductor memory device according to the present invention.

FIG. 3 is a plan view of an embodiment of the cell array of the flash EEPROM semiconductor memory device according to the present invention. For the cell array in FIG. 3, four cells are connected crosswise, as a same word line (W/L). The word line (W/L) includes the first line 20, provided as a control gate in the cell region, and the second line 30 provided as a select gate in the cell region. The first line 20 and second line 30 are interconnected on the field region 70, where metal wiring 60 is connected with the common source line (CS) through the metal contact hole 50a at the center, via the gate contact hole 40. In each group of a predetermined number of cells, such as 4, 8, 15, etc., a gate contact hole can be arranged. Lengthwise, a pair of cells is connected to the bit line (B/L) through the metal contact holes 50b and 50a, respectively. The portion drawn in oblique lines, below the first line 20 in the cell region, represents the conductive layer 10, provided as a floating gate.

Figure 4:
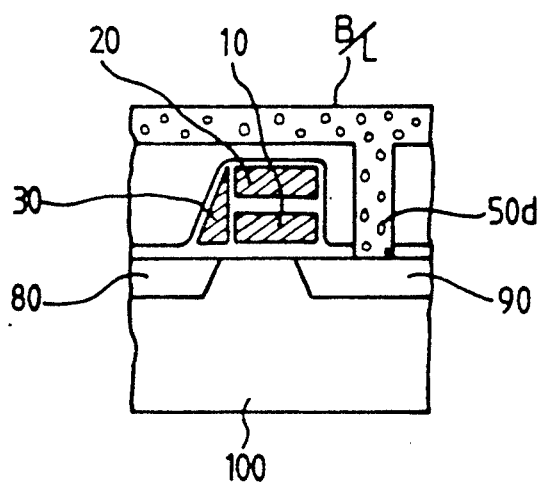
FIG. 4 is a cross-sectional view taken along the line B—B of FIG. 3.

FIG. 4 is a cross-sectional view taken along the line B—B of FIG. 3. In FIG. 4, the cell structure of the present invention has a first conductor layer 10, a second conductor layer 20, and a third conductor layer 30. The first conductor layer 10 is on substrate 100, doped with n-type or p-type impurities and insulated by an insulating film. The second conductor layer 20 covers the first conductor layer 10. The third conductor layer 30 is located along the left side wall of the twofold structure of the first and second conductor layers 10 and 20, and is in the form of a side wall spacer. These conductor groups are insulated from each other in the cell region, and are formed of polycrystalline silicon. The source region 80 and the drain region 90 are formed on opposing sides of the substrate area over which these conductor groups are located. The drain region 90 is connected to the bit-line (B/L), via the contact hole 50d.

Figure 5:
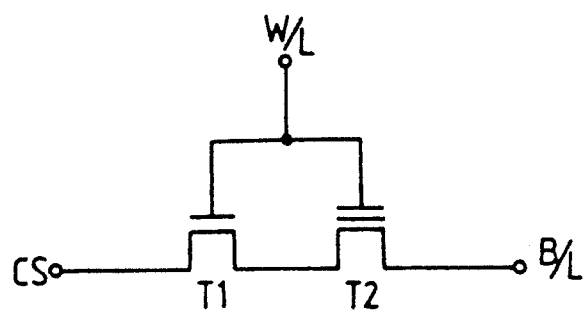
FIG. 5 is a transistor equivalent circuit diagram for the memory device of FIG. 4.

In FIG. 5, a transistor equivalent-circuit diagram for the memory device of FIG. 4 is shown. Transistor T1 is the select transistor, and transistor T2 is the cell transistor. The source electrode of the transistor T1 is connected with the common source line (CS), and the drain electrode of the transistor T2 is connected with the bit-line (B/L). The drain electrode of the transistor T1 is shared with the source electrode of the transistor T2. The gate electrodes of the transistors T1 and T2 are connected with the word line (W/L). The transistor T2 includes the floating gate electrode. During the read operation, by injecting or erasing the charge into or from the floating gate electrode, to change the threshold voltage, the data of "0" or "1" can be stored in accordance with the conducting state (ON state) or the non-conducting state (OFF state) of transistor T2.

Figure 6:
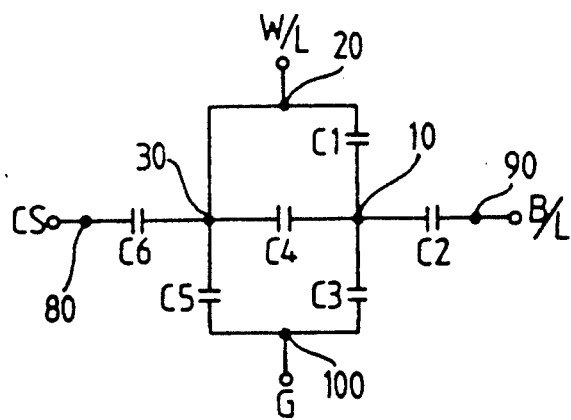
FIG. 6 is a capacitor equivalent circuit diagram for the memory device of FIG. 4.

In FIG. 6, a capacitor equivalent-circuit diagram for FIG. 4 is shown. Capacitor Cl represents the capacitive coupling between the control gate electrode 20 and the floating gate electrode 10; capacitor C2 represents the capacitive coupling between the floating gate electrode 10 and the drain electrode 90; capacitor C3 represents the capacitive coupling between the floating gate electrode 10 and the substrate 100; capacitor C4 represents the capacitive coupling between the floating gate electrode 10 and the select gate electrode 30; capacitor C5 represents the capacitive coupling between the select gate electrode 30 and the substrate 100; capacitor C6 represents the capacitive coupling between the select gate electrode 30 and the source electrode 80. The control gate electrode 20 and the select gate electrode 30 are connected together through the gate contact hole 40 of FIG. 3, and coupled with the word line (W/L). Substrate 100 is grounded as indicated at G.

When programming data into the cell structure having the capacitive couplings, assuming that voltage (VBL) of 7~12 V is applied to the bit-line (B/L), and voltage (VPG) of 8~15 V is applied to the word line (W/L), a part of the voltages which are applied to the word line (W/L) and the bit-line (B/L) will be applied to the floating gate electrode 10, in accordance with the capacitance ratio of the capacitors. That is, the floating gate voltage VIO is determined by this formula:

$$V_{10} = \frac{(C_1 + C_4) \, VPG + C_2 \times VBL}{C_1 + C_2 + C_3 + C_4}$$

On this occasion, the select transistor T1 will be turned "ON" by the program gate voltage VPG, and the cell transistor T2 will operate in the saturation region at proper VPG and VBL. Hot carriers will be generated in the drain region 90 of the cell transistor T2 by the electric field, and these hot carriers, i.e., hot electrons, will be injected into the floating gate 10. Therefore, the threshold voltage of the cell transistor T2 will be raised, and the cell transistor will be turned "OFF" during the read operation of the cell. Thus the date "1" will be stored.

On the other hand, in the case of erasing the programmed cell data, voltages of 10~18 V are applied to the bit-line (B/L) to draw out the electrons from the floating gate 10, by tunneling the electrons through a thin gate-oxide film between the drain region 90 and the floating gate 10 and, therefore, the threshold voltage of the cell transistor T2 will be lowered. Thus the cell transistor T2 will be turned "ON," and the data "0" will be read out.

During programming, even the select transistor T1 of the cells of a non-selected word line (W/L) connected to a selected bit-line (B/L) are turned "ON" by the voltage applied to the selected bit-line. Those select transistors T1 cut off current flow. Thus, not only is the programming of non-selected cells prevented, the programming of a selected cell is made more efficient.

Furthermore, in case the threshold voltage of the cell transistor T2 is lowered below the virgin threshold voltage by excessive tunneling of electrons from the floating gate 10, due to overerase, the select transistor T1 always has the virgin threshold voltage and, as a result, prevents the reading of incorrect data caused by the fact that the cell is turned "ON" at a low word-line voltage during the read operation.

FIGS. 7A and 7B through 16A and 16B are cross-sectional views taken along the lines B—B and C—C of FIG. 3, illustrating a processing sequence for completing the structure of the flash EEPROM device according to the present invention.

Figure 7A:
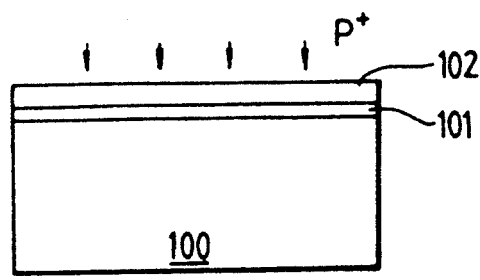
Figure 7B:
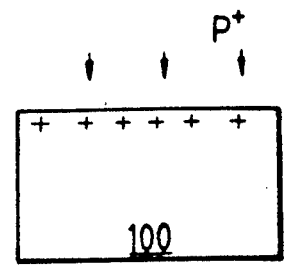

As shown in FIGS. 7A and 7B, an active region is defined on the substrate 100, doped with p-type impurities. Silicon oxide layer 101 and nitride layer 102 are formed one after another, the nitride layer 102 covering the oxide layer 101. Then the silicon oxide layer and nitride layer in the field region are removed by applying an active mask. After that, p-type impurities are injected, to form a channel stop layer within the substrate 100 defined as the field region.

Figure 8A:
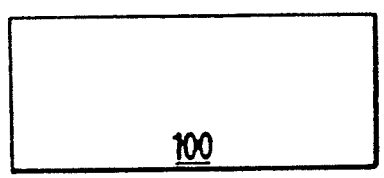
Figure 8B:
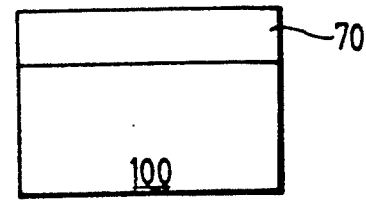

FIGS. 8A and 8B illustrate cross-sectional views. After completing the procedures in FIGS. 7A and 7B, a thick field oxide layer 70 is grown and then the silicon oxide layer 101 and nitride layer 102 in the active region are removed.

Figure 9A:
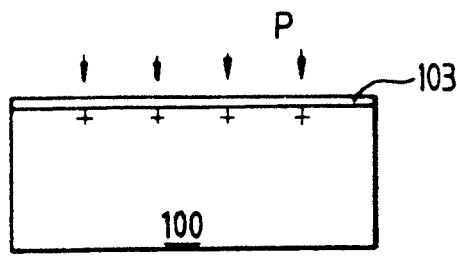
Figure 9B:
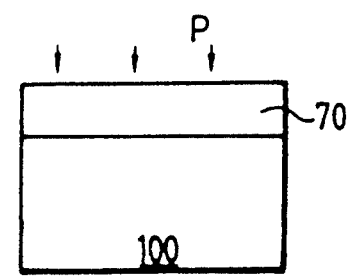

FIGS. 9A and 9B show the procedures whereby, after completing the procedures in FIGS. 8A and 8B, the first gate oxide film 103 of 200 Å, or below, is grown, and p-type impurities are injected to adjust the threshold voltage of the transistor.

Figure 10A:
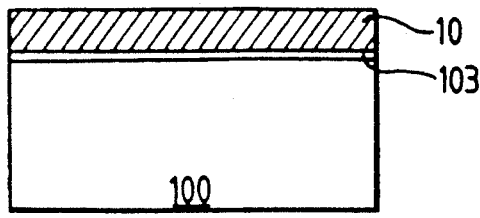
Figure 10B:
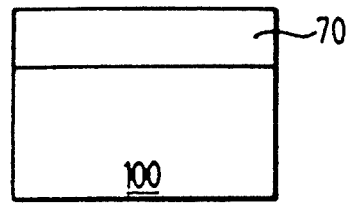

FIGS. 10A and 10B are cross-sectional views showing that after completing the procedures in FIGS. 9A and 9B, a first polycrystalline silicon layer 10 is formed, covering the gate oxide film; impurities such as phosphorus are injected to increase the conductivity of the first polycrystalline silicon layer 10, and then the first polycrystalline silicon layer, which had not been subjected to self-aligned etching, is etched.

Figure 11A:
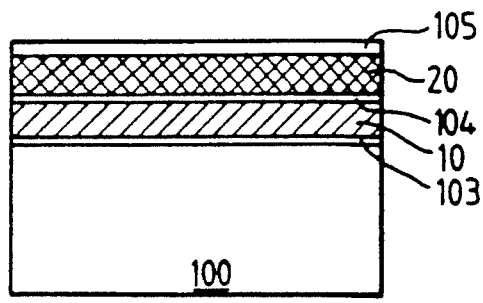
Figure 11B:
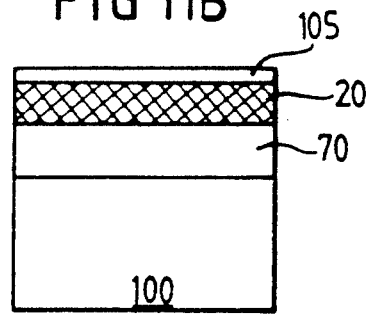

FIGS. 11A and 11B are cross-sectional views showing that after completing the procedures in FIGS. 10A and 10B, a first intermediate insulation film 104 such as $SiO_2$ is formed, covering the first polycrystalline layer 10 to electrically insulate the layer 10; the second polycrystalline silicon layer 20 is deposited over the insulation layer 104; impurities, e.g., phosphorus, are injected to increase the conductivity of the second polycrystalline silicon layer 20; and a second intermediate insulation film 105 such as $SiO_2$ is formed, covering the second polycrystalline silicon layer 20.

Figure 12A:
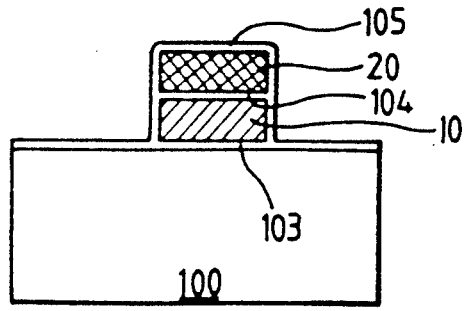
Figure 12B:
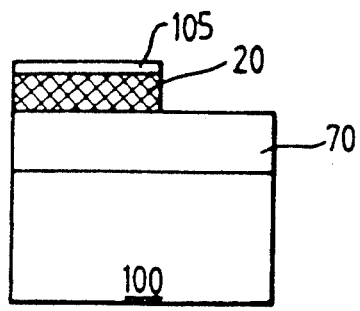

FIGS. 12A and 12B are cross-sectional views showing that after completing the procedures in FIGS. 11A and 11B, the second intermediate insulation film 105, the second polycrystalline silicon layer 20, the first intermediate insulation film 104, and the first polycrystalline silicon layer 10 are etched, to define the wordline, by applying a self-aligned mask.

Figure 13A:
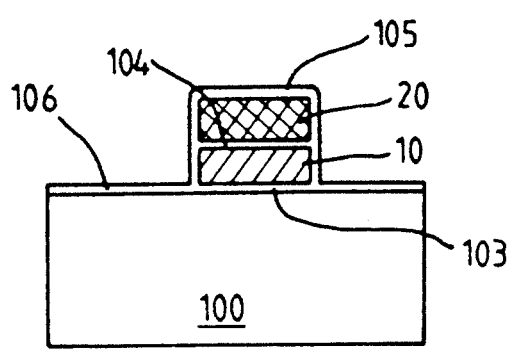
Figure 13B:
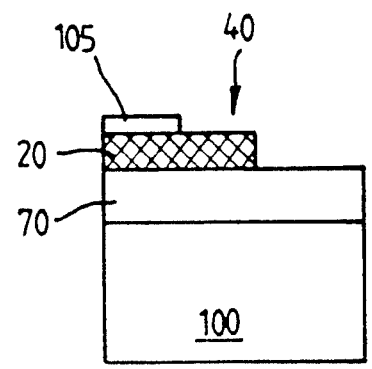

FIGS. 13A and 13B show the procedures where, after completing the procedures in FIGS. 12A and 12B, the second gate oxide film 106 is formed, and the second intermediate insulation film 105 is etched, by applying a gate contact mask to form a gate contact hole 40, which is used to connect the control gate conductor with the select gate conductor.

Figure 14A:
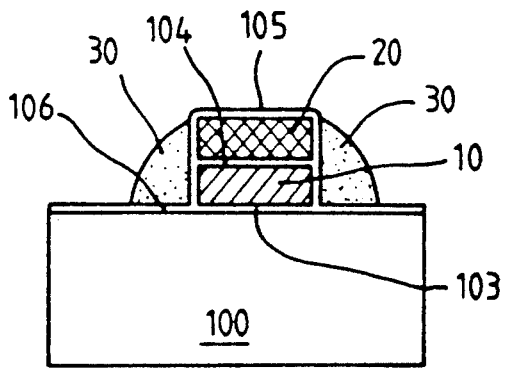
Figure 14B:
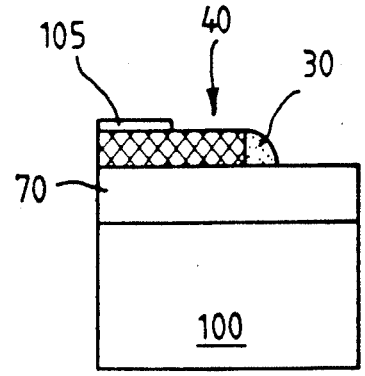

FIGS. 14A and 14B show that after completing the procedures in FIGS. 13A and 13B, the third polycrystalline silicon layer is deposited; phosphorus is injected to increase the conductivity; and then the third polycrystalline silicon layer is etched, by applying the etchback process, to form a side wall spacer 30. Here, the side wall spacer 30 is formed along both side walls of the twofold structure of the first and the second polycrystalline silicon layers 10 and 20 as shown.

Figure 15A:
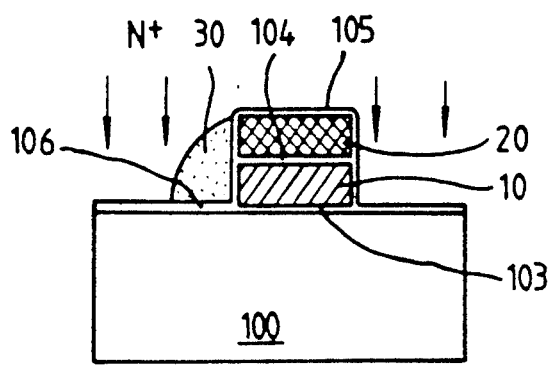
Figure 15B:
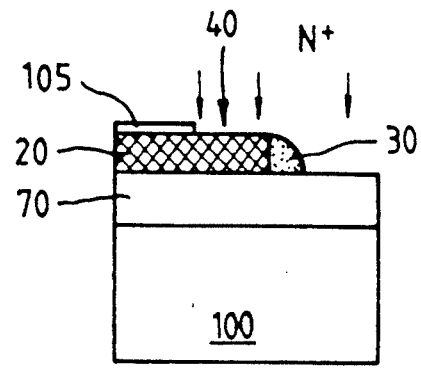

FIGS. 15A and 15B show that after completing the procedures in FIGS. 14A and 14B, the side wall spacer 30 at the drain region 90 is removed, and n-type impurities are injected into the active region to form the source and drain region. The side wall spacer 30 is now along just one side wall of the twofold structure of the first and second polycrystalline silicon layers 10 and 20 as shown.

Figure 16A:
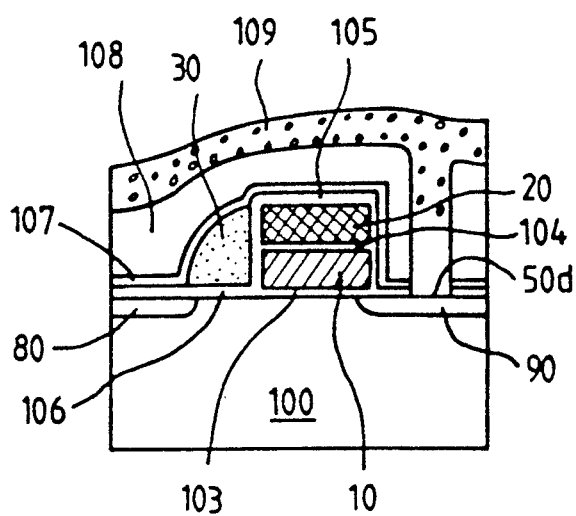
Figure 16B:
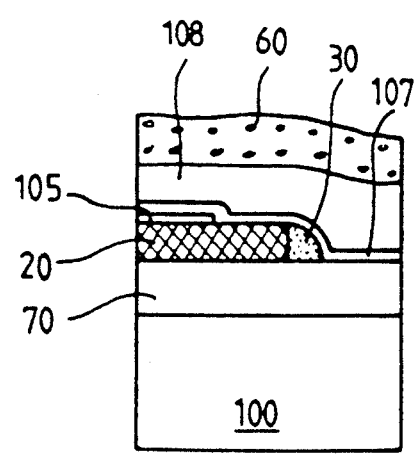

FIGS. 16A and 16B are cross-sectional views showing that after completing the procedures in FIGS. 15A and 15B, the third intermediate insulation layer 107 such as $SiO_2$ is formed covering the layers beneath; a thick borophosphosilicate glass (BPSG) layer 108 containing boron and phosphorus is grown at low temperature as a fourth intermediate insulation layer; then contact hole 50d is formed and metal is deposited by applying a metal contact mask; then metal wiring procedure is done by applying a metallic mask.

The boro-phosphosilicate glass layer BPSG is grown at a low temperature to improve the coverage of metal wiring. The BPSG layer is an insulator between polysilicon gates and the metallization at the top level. A concave shape in the oxide going over the polysilicon gate can cause an opening in the metal film, resulting in device failure; applying heat at low temperature until the oxide softens and flows can improve that situation. A temperature below 600° C. is sufficient for that purpose.

As described above, the present invention can minimize the area of flash EEPROM cells including a select transistor. Large capacity EEPROM can be achieved. Substrate etching problems during self-align etching caused by structural disadvantages can be avoided. Furthermore, during fabrication procedures, misalignment of the select transistor having a side wall spacer structure and the cell transistor having a twofold polycrystalline silicon structure can be eliminated.

What is claimed is:

1. A nonvolatile semiconductor memory device including a plurality of memory cells, comprising:
    a silicon substrate doped with an impurity;
    a group of electrically insulated gate conductors on said substrate including:
        a first gate conductor provided as a floating gate;
        a second gate conductor provided as a control gate and covering said first gate conductor; and
        a third gate conductor provided as a select gate; said third gate conductor being formed along a side wall of the first and second gate conductors as a side wall spacer;
    said second and third gate conductors being connected via a gate contact hole which is formed on a field oxide layer between memory cells.

2. A nonvolatile semiconductor memory device according to claim 1, wherein a gate contact hole is provided in each of a plurality of groups of a predetermined number of memory cells.

3. A nonvolatile semiconductor memory device according to claim 2, wherein said first, second and third conductors are formed with polycrystalline silicon.

4. A non-volatile semiconductor memory device comprising:
    a doped substrate;
    a first conductor layer formed on said substrate, including a plurality of portions each constituting a respective floating gate for a corresponding memory cell;
    a second conductor layer formed on said substrate and covering said first conductor layer, including a plurality of portions each constituting a respective control gate for a corresponding memory cell; each said control gate covers a corresponding floating gate of the same memory cell;
    a third conductor layer formed on said substrate and having the structure of a side wall spacer along one side wall of the twofold structure of the first and second conductor layers, including a plurality of portions each constituting a select gate for a memory cell; each said select gate being positioned along one side wall of the twofold structure of the floating gate and control gate of the same memory cell;

said first, second, and third conductors are insulated from each other in the memory cell regions, and said second and third conductors are connected in an area in between memory cells.

5. A memory device as recited in claim 4, wherein: the memory cells are separated from each other by a field oxide layer; and said connection between the second and third conductor layer includes a connection through a contact hole in said field oxide layer.

6. A memory device as recited in claim 4, wherein: the memory cells are separated from each other by a field oxide layer; said connection between the second and third conductor layer includes a plurality of connections each being located in between memory cells; and each said plurality of connections being through a corresponding contact hole in said field oxide layer.

7. A memory device as recited in claim 4, wherein: each said first, second, and third conductor layer is formed of polycrystalline silicon.

* * * * *